United States Patent
Peschke et al.

(10) Patent No.: US 11,054,467 B2
(45) Date of Patent: Jul. 6, 2021

(54) DYNAMIC PROBE, DYNAMIC MEASUREMENT SYSTEM AND METHOD FOR PROBING A DYNAMIC DATA SIGNAL

(71) Applicant: Rohde & Schwarz GmbH & Co. KG, Munich (DE)

(72) Inventors: Martin Peschke, Vaterstetten (DE); Alexander Kunze, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 443 days.

(21) Appl. No.: 15/981,478

(22) Filed: May 16, 2018

(65) Prior Publication Data
US 2018/0335476 A1   Nov. 22, 2018

(30) Foreign Application Priority Data

May 18, 2017  (EP) ..................... 17171743

(51) Int. Cl.
*G01R 31/317*     (2006.01)
*G01R 1/067*      (2006.01)

(52) U.S. Cl.
CPC ... *G01R 31/31701* (2013.01); *G01R 1/06766* (2013.01); *G01R 1/06788* (2013.01)

(58) Field of Classification Search
CPC ............... G01R 15/00; G01R 1/07342; G01R 1/06772; G01R 31/2886; G01R 3/00; G01R 31/2889; G01R 31/31701; G01R 1/06788; G01R 1/06766; G01R 31/317; G01R 1/067

See application file for complete search history.

(56) References Cited

U.S. PATENT DOCUMENTS

| | | |
|---|---|---|
| 3,551,839 A | 12/1970 | Barker |
| 4,954,782 A | 9/1990 | Ball |
| 5,293,122 A | 3/1994 | Cake et al. |
| 5,319,305 A | 6/1994 | Baba |
| 5,680,039 A | 10/1997 | Mochizuki et al. |
| 6,542,838 B1 | 4/2003 | Haddad et al. |
| 6,812,685 B2 | 11/2004 | Stever et al. |
| 2005/0088168 A1 | 4/2005 | Reasoner |
| 2007/0273438 A1 | 11/2007 | Hickman et al. |
| 2016/0139178 A1* | 5/2016 | Johnson ............. G01R 1/30 324/754.03 |
| 2018/0231585 A1* | 8/2018 | Peschke ............. G01R 13/0254 |

* cited by examiner

*Primary Examiner* — Jermele M Hollington
*Assistant Examiner* — Suresh K Rajaputra
(74) *Attorney, Agent, or Firm* — Christensen O'Connor Johnson Kindness PLLC

(57) ABSTRACT

A dynamic probe for probing a dynamic data signal comprising a switching unit configured to provide at least two different input impedances, wherein the switching unit is configured to select a first input impedance in a first mode and a second input impedance in a second mode, the switching unit being configured to be operated dynamically based on an event in the data signal processed. Further, a dynamic measurement system and a method for probing a dynamic data signal are described.

21 Claims, 2 Drawing Sheets

DYNAMIC PROBE, DYNAMIC MEASUREMENT SYSTEM AND METHOD FOR PROBING A DYNAMIC DATA SIGNAL

FIELD OF THE DISCLOSURE

Embodiments of the present disclosure relate generally to a dynamic probe, a dynamic measurement system and a method for probing a dynamic data signal.

BACKGROUND

In the state of the art, measurement systems for probing digital signals are known which comprise different probes to be used for different operation modes of the device under test. Accordingly, the different probes are configured for a certain purpose. For instance, a fast probe is provided for a high speed mode of the measurement system. This fast probe may be established by a differential probe. In addition, a slow probe can be provided that is used in a low-power mode of the measurement system. The slow probe is established by a mass-referred probe, for instance.

In case the measurement system is used for probing a device under test that changes its characteristics dynamically during the probing, different measurements have to be carried out. For instance, at least two different measurement systems are used wherein these measurement systems are configured to be operated in different modes while using appropriate probes. The different measurement systems can be used simultaneously or sequentially.

Alternatively, the device under test is measured by a single measurement system several times in a sequential manner while using different corrections being adapted to the operation mode of the device under test. For instance, de-embedding with a certain source impedance in a high speed mode and de-embedding with another source impedance in a low-power mode. The different source impedances are set manually.

However, performing different measurements always requires additional efforts as the different measurements have to be compared and scaled appropriately. Furthermore, this might be a source of errors as the device under test has to be contacted at least twice.

Therefore, there is a need for a measurement probe, a measurement system and a method that ensure measuring a dynamic data signal in a more efficient way and that reduce the risk of error simultaneously.

SUMMARY

Embodiments of the present disclosure provide a dynamic probe for probing a dynamic data signal comprising a switching unit configured to provide at least two different input impedances, wherein the switching unit is configured to select a first input impedance in a first mode and a second input impedance in a second mode, the switching unit being configured to be operated dynamically based on an event in the data signal processed.

Further, embodiments of the present disclosure provide a method for probing a dynamic data signal with the following steps:

providing a dynamic probe for probing a dynamic data signal;

providing a test and measurement device having a probe interface for receiving a probe signal corresponding to the dynamic data signal;

processing the probe signal received by the probe; and selecting a first mode or a second mode based on an event in the data signal such that a switching unit of the dynamic probe is dynamically switched to a first mode or to a second mode for processing the data signal.

Accordingly, the measurement time and measurement efforts can be reduced significantly since a switching unit is used to dynamically adapt the characteristics of the probe over the time with regard to the dynamically changing characteristics of the device under test that is probed. This adaption is performed during the probing. Since the operation mode of the probe, for example the switching unit, is dynamically adapted with regard to the changing characteristics of the device under test, only a single contact is necessary for probing the device under test even though the device under test changes its characteristics dynamically over the time. Therefore, it is not necessary to compound the measurement results obtained by different measurements, for example different probes.

The dynamically changing characteristics of the device under test may relate to a changing operation mode of the device under test being probed. Accordingly, these changing characteristics of the device under test can be measured by the same probe without recontacting the device under test. Thus, the risk of error is reduced while probing the device under test. Typically, bus signals comprise different operation modes.

The switching unit may be implemented by a switching circuit that comprises at least one switch member. Moreover, further components are provided in the switching circuit for processing the data signal appropriately.

According to an aspect, the switching unit is configured to change the mode automatically. Hence, no manual input is required to switch the probe appropriately. In addition, the switching unit is configured to ensure fast switching processes such that dynamically changing characteristics of a signal can be probed while setting different operation modes of the probe depending on the signal received, for example any events in the data signal processed. In addition, a manual operation would be to slow in order to react on changing characteristics of the data signal probed.

According to another aspect, a detection unit is provided that is configured to detect the event in the data signal. The detection unit detects a certain event in the data signal that may correspond to another operation mode of the device under test. Thus, the detection unit is configured to detect a dynamic change in the data signal. Based on the detection of the event, the detection unit may control the switching unit such that the switching unit selects the appropriate mode for processing the data signal.

The detection unit may be integrated in the dynamic probe itself. Thus, the dynamic probe is suitable for high voltage and low voltage signals. In some embodiments, a single probe is sufficient for the dynamic data signal which comprises different signal portions that may relate to different operation modes of the device under test. The probe may comprise the detection unit such that the event is detected by the probe itself. The event is detected in the dynamic data signal probed. Further, the occurrence of such an event may be indicated by the probe, for instance by a light emitting diode implemented.

Furthermore, a trigger unit may be provided that is configured to derive at least one event from the data signal in order to control the switching unit. The trigger unit is separately formed with respect to an acquisition trigger unit that is configured to trigger the beginning of the probing. The trigger unit controls the switching unit with regard to a dynamically changing data signal, for example changing characteristics of the data signal that may relate to a different operation mode of the device under test.

For instance, the detection unit has a trigger function such that the detection unit comprises the trigger unit. In other words, the detection unit and the trigger unit may be implemented in each other.

The trigger unit may be configured to automatically adapt the switching unit, for example components of the switching unit. Accordingly, no manual input is required to adapt the switching unit that comprises a circuit with different components.

Generally, the trigger unit may be a mode trigger.

For instance, the first mode is a high voltage mode and/or the second mode is a low voltage mode. Thus, the dynamic probe is suitable for probing and processing high voltage and low voltage data signals as the probe, for example the switching unit, is adapted appropriately, for example in an automatic manner. The appropriate adaption is inter alia realized by adapting the input impedance of the probe accordingly.

The switching unit may be configured such that a first voltage divider is switched on in the first mode and/or a second voltage divider having at least a lower division ratio is switched on in the second mode. In the different modes of the probe, different voltages are processed by the switching unit, for example the switching circuit. Thus, it can be ensured that the different signals or signal portions are processed in an appropriate manner, for example with regard to a test and measurement device, for instance an oscilloscope, that is connected to the probe. Generally, the voltage dividers attenuate the signals processed appropriately.

In some embodiments, the switching unit is configured such that no voltage divider is provided for the second mode. Accordingly, the switching unit, for example the switching circuit, comprises at least one voltage divider that is switched on when the first mode is activated whereas the low voltage signals in the high-speed mode may be processed without any attenuation.

According to another aspect, the switching unit is configured such that a first amplifier is switched on in the first mode and/or a second amplifier is switched on in the second mode. Therefore, the probe may comprise two different amplifiers that are allocated to a certain mode for processing the data signal appropriately depending on the mode selected. If a certain event occurs in the data signal processed, the data signal is forwarded to the respective amplifier. Therefore, the switching unit ensures that the data signal processed is forwarded to the appropriate amplifier.

In some embodiments, the first amplifier is a high voltage, low frequency amplifier and/or the second amplifier is a low voltage, high frequency amplifier. These amplifiers ensure processing the data signals in the respective modes, for example provided that the modes relate to high voltage mode and low voltage modes, respectively. Furthermore, it is ensured that broadband signals can be processed by the second amplifier.

In general, the switching unit may be established by a switching circuit having two circuit portions relating to the first and second modes. In the first circuit portion, the first voltage divider and the first amplifier are provided whereas the second amplifier and (optionally) the second voltage divider are provided in the second circuit portion.

Moreover, the first mode can be a single ended mode and/or the second mode may be a differential mode. The probe may have two different contacts for probing a first signal and a second signal, for instance a positive line and a negative line. One of these signals may be constant relating to a constant voltage such as ground. Alternatively, both signals are complementary to each other.

According to another aspect, the switching unit is configured to apply a first signal offset voltage in the first mode and a second signal offset voltage in the second mode, both signal offset voltages being different. Accordingly, different offset voltages can be applied provided that the modes relate to different signal levels of the data signal processed. This simplifies the illustrating purposes on a test and measurement device used for illustrating the data signals probed.

An aspect provides that the event is detected by a detection unit. The detection unit screens the dynamic data signal for dynamic changes representing an event.

Generally, the event can be at least one of a certain signal level, a signal mode (P-mode, N-mode, differential mode or common mode), an impedance, for instance a terminating impedance or a source impedance, a certain common mode level, a certain data rate, a certain shape of the signal (portion), predefined times and a decoded signal (portion).

According to another aspect, the mode of the probe is set automatically by using a trigger unit that derives at least one event from the data signal and, further, controls the switching unit. The trigger unit searches for certain events and controls the switching unit appropriately. As already mentioned, the trigger unit may be implemented in the detection unit such that the detection of the event and the controlling is done by the same unit.

The probe may contact a device under test providing the dynamic data signal only once. Therefore, it is not necessary to perform different measurements in a sequential manner wherein the device under test has to be contacted several times, for example with different probes.

In some embodiments, a dynamic probe as mentioned above is provided for performing the probing.

Embodiments of the disclosure further provide a dynamic measurement system that comprises a test and measurement device and a dynamic probe as described above. The dynamic probe may be connected to the measurement device such that the data signal probed is processed by the probe and forwarded to the test and measurement device that receives a probe signal corresponding to the data signal.

According to an aspect, a detection unit is integrated in the test and measurement device wherein the dynamic probe has a control interface connected to a probe interface of the test and measurement device such that the detection unit is configured to control the dynamic probe. The test and measurement device detects the event in the probe signal corresponding to the data signal provided by the device under test. Therefore, the test and measurement device controls the probe appropriately such that the respective mode is set for probing the data signal correctly. Accordingly, the detection unit may comprise the trigger unit that is used for controlling the probe once an event was detected.

The test and measurement device may be an oscilloscope. The oscilloscope is connected with the probe such that the device under test is contacted by the probe for generating the probe signal that is forwarded to the oscilloscope for analyzing purposes. The detection unit (of the dynamic probe or the test and measurement device) detects the event in the data signal or the probe signal corresponding to the data signal.

The test and measurement system may be configured to use a single probe such that a single measurement channel of the test and measurement device is occupied during probing the dynamic data signal. As only one measurement channel is occupied, the test and measurement device, for example the oscilloscope, can be established in a simpler manner. Further, other measurement channels of the test and measurement device can be used for other measurements. Thus, the costs can be reduced for doing different measurements simultaneously.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
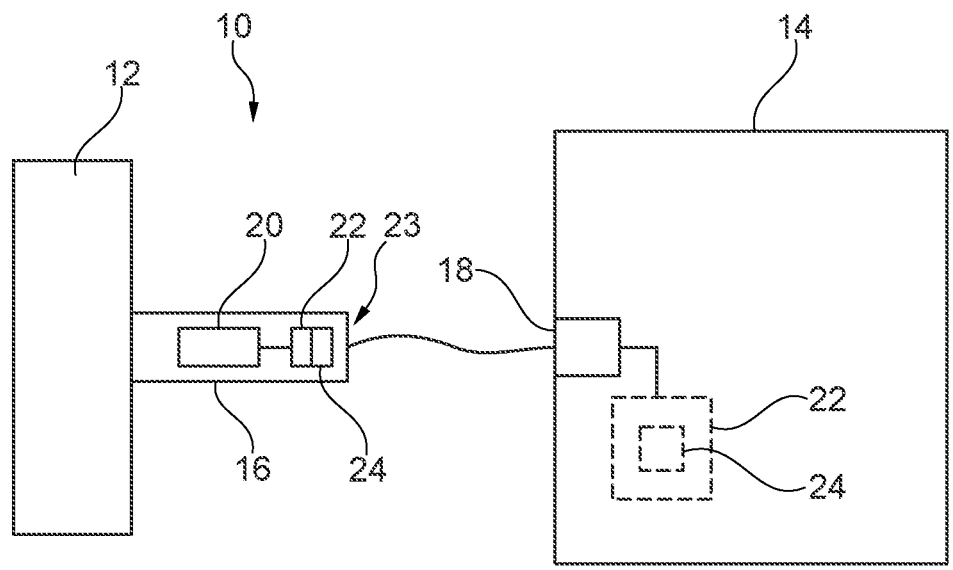
FIG. 1 schematically shows a dynamic measurement system according to an embodiment of the present disclosure, FIG. 2 schematically shows a diagram of a data signal gathered by a dynamic measurement system according to an embodiment of the present disclosure, FIG. 3 schematically shows a switching unit of a dynamic probe according to an embodiment of the present disclosure, and FIG. 4 schematically shows a detail of a dynamic measurement system according to an embodiment of the present disclosure.

In FIG. 1, a dynamic measurement system 10 is shown that is used for probing a dynamic data signal from a device under test 12. The dynamic measurement system 10 comprises a test and measurement device 14 and a dynamic probe 16 that is connected with the measurement device 14 via a probe interface 18 formed at the measurement device 14. The measurement device 14 may be established by an oscilloscope.

The probe 16 directly contacts the device under test 12 for gathering the data signal transmitted by the device under test 12 wherein the data signal is converted into a probe signal that is forwarded to the measurement device 14 for further processing, for example for analyzing purposes, etc.

The dynamic probe 16 has a switching unit 20 that is shown in more detail in FIG. 3 and will be described later. In general, the switching unit 20 is configured to provide at least two different input impedances that relate to different modes of the probe 16 wherein the switching unit 20 is configured to operate dynamically based on an event in the data signal processed.

For detecting the event in the data signal, the probe 16 comprises a detection unit 22 as shown in FIG. 1. The detection unit 22 is connected to the switching unit 20 such that the switching unit 20 is controlled by the detection unit 22 based on an event detected in the data signal probed. Thus, the mode of the probe 16 is changed when the detection unit 22 detects a certain event, for instance a certain signal level, a signal mode (P-mode, N-mode, differential mode or common mode), a certain impedance, for instance terminating impedance or source impedance, a certain common mode level, and/or a certain data rate. Accordingly, the detection unit 22 integrated in the probe 16 scans the analog dynamic data signal probed.

Alternatively or supplementary, the test and measurement device 14 comprises a detection unit 22 (dashed lines). The detection unit 22 integrated in the test and measurement device 14 is connected to the probe interface 18 such that the detection unit 22 receives the analog probe signal before it is digitized by an internal acquisition unit of the test and measurement device 14. Alternatively, the detection unit 22 receives an already digitized probe signal.

However, the detection unit 22 integrated in the test and measurement device 14 detects the certain event and generates a control signal that is forwarded to the probe 16 such that the respective mode of the probe 16 is set, for example by adapting the switching unit 20 appropriately. Accordingly, the test and measurement device 14 is configured to control the dynamic probe 16 based upon events occurring in the data signal probed. The probe 16 has an appropriate control interface 23 for receiving the control signals.

Furthermore, a trigger unit 24 may be provided that is configured to derive an event from the data signal. This trigger unit 24 differs from an acquisition trigger unit (not shown) that is configured to trigger the beginning of the probing.

According to the shown embodiment, the detection unit 22 and the trigger unit 24 are formed integrally such that the detection unit 22 has a triggering function. Alternatively to the shown embodiment, the detection unit 22 and the trigger unit 24 may be formed separately.

In general, the detection unit 22 detects an event in the data signal and triggers the switching unit 20 appropriately based on the event detected. In some embodiments, the trigger unit 24 controls the switching unit 20 such that a certain mode is selected based on the event detected wherein the mode selected relates to a certain setting of the switching unit 20, for example the switching of certain components of the switching unit 20 that is established by a circuit. This will be described hereinafter with regard to FIGS. 2 and 3.

Figure 2:
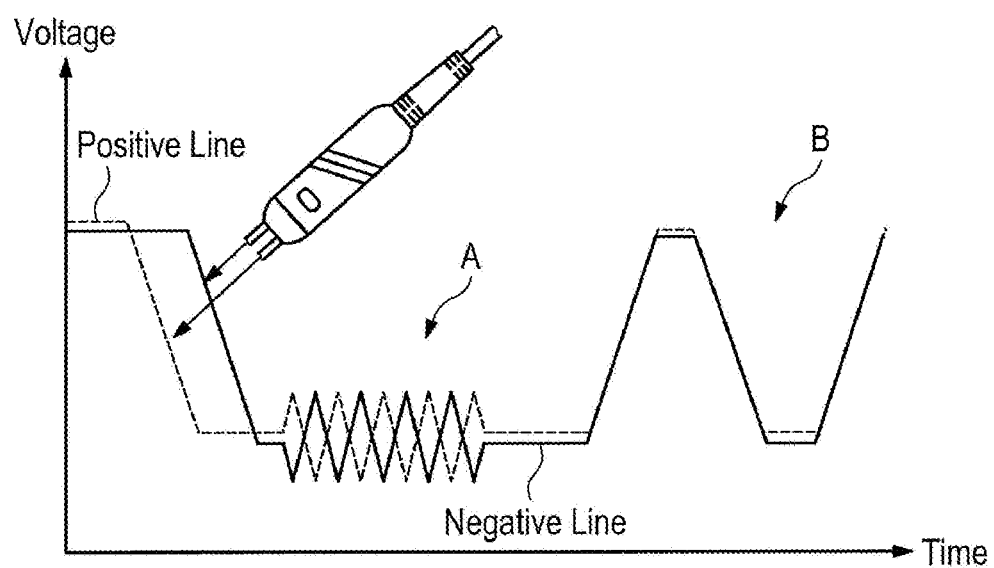

As already mentioned, the detection unit 22 detects a certain event in the data signal that may relate to dynamically changing characteristics of the dynamic data signal. These dynamically changing characteristics of the dynamic data signal may correspond to a different operation mode of the device under test 12 probed, for instance a changing source impedance of the device under test 12 due to a changing from a high speed operation mode A to a low power operation mode B or vice versa as shown in FIG. 2.

As already mentioned, at least two different operation modes are provided, namely the high speed operation mode A and the low power operation mode B, which may relate to a low voltage mode and a high voltage mode. Moreover, these operation modes may relate to a differential mode and a single ended mode, respectively.

Upon the detection of the event in the probe signal, the trigger unit 24 triggers such that the switching unit 20 selects a certain mode, for example the first mode or the second mode.

Figure 3:
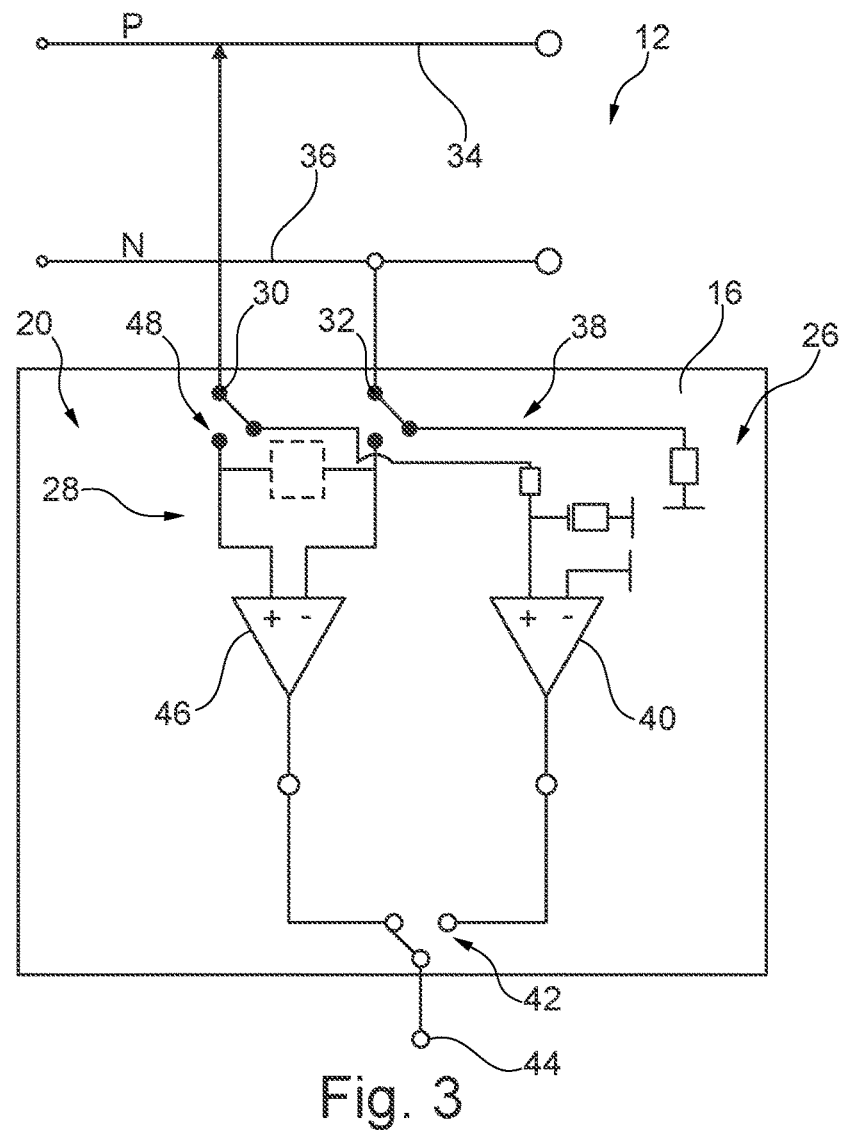

In the shown embodiment in FIG. 3, the switching unit 20 has two circuit portions 26, 28 relating to the first and second modes wherein switching members 30, 32 are allocated to the respective circuit portions 26, 28. In FIG. 3, the switching members 30, 32 are switched such that the data signal probed from a positive line 34 (P-line) and a negative line 36 (N-line) of the device under test 12 are forwarded to the first circuit portion 26 relating to the first mode.

For instance, the first mode relates to a single ended mode, for example a single ended P mode.

The first circuit portion 26 comprises a first voltage divider 38 with a resistance of 1 MΩ wherein the voltage divider 38 is allocated to the P-line 34. Thus, the input impedance of the first circuit portion 26 allocated to the first mode is defined by the resistance of 1 MΩ.

The voltage divider 38 is also connected to a first amplifier 40, for example a first input thereof, wherein the first amplifier 40 is a high voltage, low frequency amplifier while being configured to process signals having frequencies up to 10 MHz, for instance. Accordingly, broadband signals can be processed by the first amplifier 40. The first amplifier 40, for example a second input thereof, and the resistance of 1 MΩ both are connected to a common ground.

The data signal probed and processed by the first circuit portion 26 is forwarded to an output switching member 42 that is allocated to an output 44 of the probe 16. The output 44 is connected to the test and measurement device 14 such that the probe signal generated is forwarded to the test and measurement device 14 appropriately.

The first circuit portion 26 is used for processing the signal portions of the data signal indicated by B in FIG. 2.

Further, the second circuit portion 28 is used for processing the data signal probed in a second mode, for instance for processing differential signals relating to a second operation mode of the device under test 12 as indicated in FIG. 2 by A. Accordingly, the second circuit portion 28 has a second amplifier 46 that is fed with signals probed from both lines, namely the P-line 34 and the N-line 36. Hence, both inputs of the second amplifier 46 are allocated to the signal lines 34, 36 of the device under test 12. The second amplifier 46 is a low voltage, high frequency amplifier that is configured to process signals up to frequencies of 10 GHz, for instance.

In the shown embodiment, the second circuit portion 28 has a second voltage divider 48 having a lower division ratio since the second voltage divider 48 comprises a second resistance of 1 kΩ. As the second circuit portion 28 may have no second voltage divider in another embodiment, the resistor of the second voltage divider 48 is illustrated by dashed lines.

Accordingly, the input impedance of the probe 16 is changed in the second mode with regard to the first mode while having a first input resistance of 1 MΩ in the first mode compared to a second input resistance of 1 kΩ in the second mode.

As the first operation mode of the device under test 12 may be a low-speed mode, no or less terminal impedance occur. In contrast thereto, the terminal impedance increases in the high-speed mode (second operation mode) such that it is important to provide matching impedances in order to avoid reflections.

In general, the voltage dividers 38, 48 are inter alia established by the input resistances of the test and measurement device 14 connected to the probe 16.

The output of the second amplifier 46 is also allocated to the output switching member 42 such that the probe signal relating to the data signal in a second mode is outputted via the output 44.

Accordingly, the probe 16 ensures that different signals as well as different signal portions can be measured while using the single probe 16.

The detecting unit 22 and the triggering unit 24 ensure that a certain event (trigger event) is detected in the data signal probed wherein the switching unit 20 is controlled appropriately, for example the switching members 30, 32, 42 in order to process the data signal by the respective circuit portion 26, 28 of the switching unit 20.

The switching unit 20 is further configured to apply a first signal offset voltage and a second signal offset voltage respectively such that the signals probed can be processed appropriately. For instance, the first circuit portion 26 may be configured to process voltages up to 3 V whereas the second circuit portion 28 may be configured to process voltages up to 300 mV.

Figure 4:
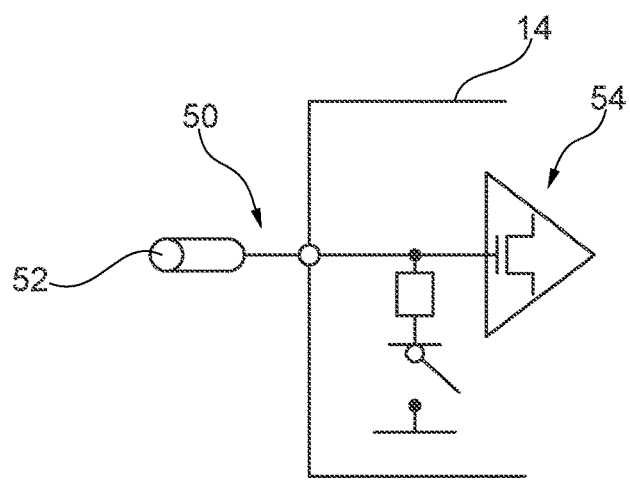

In FIG. 4, an input 50 of the test and measurement device 14 is shown that is connected to a cable 52 of the probe 16, for instance a coaxial cable. The input 50 is allocated to a bus receiver circuit 54 such that the test and measurement device 14 is configured to process bus signals in an appropriate manner.

Generally, it is ensured that the device under test 12 has to be contacted only once even though the data signal obtained changes dynamically during the probing.

In some embodiments, the first mode corresponds to a broadband and differential mode that is optimized for measuring lines having a resistance of 50Ω.

In some embodiments, the second mode corresponds to a narrowband and high resistance mode that is optimized for measuring slow mass-referred (single-ended) bus systems.

The total measurement time and the risk of errors are reduced while the quality of the measurement is increased simultaneously.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A dynamic probe for probing a dynamic data signal comprising a switching unit configured to provide at least two different input impedances, the switching unit being configured to select a first input impedance in a first mode and a second input impedance in a second mode, the switching unit being configured to be operated dynamically based on an event in the data signal processed.

2. The dynamic probe according to claim 1, wherein the switching unit is configured to change the mode automatically.

3. The dynamic probe according to claim 1, wherein a detection unit is provided that is configured to detect the event in the data signal.

4. The dynamic probe according to claim 1, wherein the first mode is a high voltage mode.

5. The dynamic probe according to claim 1, wherein the second mode is a low voltage mode.

6. The dynamic probe according to claim 1, wherein the switching unit is configured such that a first voltage divider is switched on in the first mode.

7. The dynamic probe according to claim 1, wherein a second voltage divider having at least a lower division ratio is switched on in the second mode.

8. The dynamic probe according to claim 6, wherein the switching unit is configured such that no voltage divider is provided for the second mode.

9. The dynamic probe according to claim 1, wherein the switching unit is configured such that a first amplifier is switched on in the first mode.

10. The dynamic probe according to claim 1, wherein a second amplifier is switched on in the second mode.

11. The dynamic probe according to claim 9, wherein the first amplifier is a high voltage, low frequency amplifier.

12. The dynamic probe according to claim 10, wherein the second amplifier is a low voltage, high frequency amplifier.

13. The dynamic probe according to claim 1, wherein the first mode is a single ended mode.

14. The dynamic probe according to claim 1, wherein the second mode is a differential mode.

15. The dynamic probe according to claim 1, wherein the switching unit is configured to apply a first signal offset voltage in the first mode and a second signal offset voltage in the second mode, both signal offset voltages being different.

16. A dynamic measurement system comprising a test and measurement device and a dynamic probe according to claim 1.

17. The dynamic measurement system according to claim 16, wherein a detection unit is integrated in the test and measurement device, the dynamic probe having a control interface connected to a probe interface of the test and measurement device such that the detection unit is configured to control the dynamic probe.

18. A method for probing a dynamic data signal with the following steps:
   providing a dynamic probe for probing a dynamic data signal;
   providing a test and measurement device having a probe interface for receiving a probe signal corresponding to the dynamic data signal;
   processing the probe signal received by the probe; and
   selecting a first mode or a second mode based on an event in the data signal such that a switching unit of the dynamic probe is dynamically switched to a first mode or to a second mode for processing the data signal.

19. The method according to claim 18, further comprising detecting the event in the data signal.

20. The method according to claim 18, further comprising contacting a device under test providing the dynamic data signal only once.

21. A dynamic probe for probing a dynamic data signal comprising a switching unit configured to provide at least two different input impedances, the switching unit being configured to select a first input impedance in a first mode and a second input impedance in a second mode, the switching unit being configured to be operated dynamically based on an event in the data signal processed, wherein the switching unit is configured to change the mode automatically depending on the event in the data signal.

* * * * *